US008901981B2

(12) United States Patent
Park et al.

(10) Patent No.: US 8,901,981 B2
(45) Date of Patent: Dec. 2, 2014

(54) MULTI-STAGE PHASE MIXER CIRCUIT USING FINE AND COARSE CONTROL SIGNALS

(71) Applicants: SK Hynix Inc., Icheon (KR); Postech Academy-Industry Foundation, Pohang (KR)

(72) Inventors: Hong June Park, Pohang (KR); Ji Hun Lim, Icheon (KR)

(73) Assignees: SK Hynix Inc., Icheon (KR); Postech Academy-Industry Foundation, Pohang (KR)

( * ) Notice: Subject to any disclaimer, the term of this patent is extended or adjusted under 35 U.S.C. 154(b) by 0 days.

(21) Appl. No.: 13/857,287

(22) Filed: Apr. 5, 2013

(65) Prior Publication Data

US 2014/0002173 A1    Jan. 2, 2014

(30) Foreign Application Priority Data

Jun. 29, 2012 (KR) .................. 10-2012-0071362

(51) Int. Cl.
*H03H 11/26* (2006.01)
*H03K 5/13* (2014.01)
*H03K 5/00* (2006.01)

(52) U.S. Cl.
CPC .................. *H03K 5/13* (2013.01); *H03K 5/131* (2013.01); *H03K 2005/00052* (2013.01); *H03K 2005/00058* (2013.01)
USPC ............................ 327/276; 327/278; 327/291

(58) Field of Classification Search
CPC ...... H03K 5/135; H03K 5/156; H03K 5/1565
USPC ......................................... 327/276–278, 291
See application file for complete search history.

(56) References Cited

U.S. PATENT DOCUMENTS

| 6,982,578 | B2 * | 1/2006 | Lee ............................... 327/158 |
| 7,274,236 | B2 * | 9/2007 | Lee ............................... 327/261 |
| 7,339,408 | B2 * | 3/2008 | Lee ............................... 327/158 |
| 7,423,468 | B2 * | 9/2008 | Cho ............................... 327/175 |
| 7,598,783 | B2 * | 10/2009 | Shin et al. .................... 327/158 |
| 7,667,507 | B2 * | 2/2010 | Neidengard .................. 327/155 |
| 8,421,515 | B2 * | 4/2013 | Kwak et al. .................. 327/277 |
| 2007/0030753 | A1 | 2/2007 | Kwak |

FOREIGN PATENT DOCUMENTS

| JP | 2011-176711 A | 9/2011 |
| JP | 2011-228958 A | 11/2011 |
| KR | 10-2001-0082556 A | 8/2001 |
| KR | 10-2002-0067736 A | 8/2002 |
| KR | 10-2006-0111016 A | 10/2006 |
| KR | 10-2009-0000512 A | 1/2009 |

* cited by examiner

*Primary Examiner* — Kenneth Wells (57) ABSTRACT

A multi-stage phase mixer circuit includes: a first phase mixer configured to receive first and second input clock signals and output a first intermediate clock signal according to control of a first coarse control signal; a second phase mixer configured to receive the first and second input clock signals and output a second intermediate clock signal according to control of a second coarse control signal; and a third phase mixer configured to receive the first and second intermediate clock signals and output an output clock signal according to control of a fine control signal.

11 Claims, 10 Drawing Sheets

MULTI-STAGE PHASE MIXER CIRCUIT USING FINE AND COARSE CONTROL SIGNALS

BACKGROUND OF THE INVENTION

1. Field of the Invention

Embodiments of the present invention relate to a multi-stage phase mixer circuit, and more particularly, to a technology for equalizing phase differences between two adjacent output clock signals generated by performing a phase mixing operation with respect to two or more input clock signals through a multi-stage process including two or more stages.

2. Description of the Related Art

In an integrated circuit chip, a phase mixer is frequently used to accomplish desirable characteristics such as a seamless boundary switching in a phase locked loop (PLL) or a delayed locked loop (DLL) that synchronizes a chip internal clock signal with an external clock signal.

A phase mixer refers to a device that receives two clock signals having the same frequency and different phases and mixes the received clock signals. The phase mixer outputs a clock signal having the same frequency as the two input clock signals and a phase between the phases of the two input clock signals through the phase mixing operation. A weight may be applied to adjust the phase of the output clock to a value close to one of the phases of the two input clock signals. For example, when the weight is 0, the phase of the output clock signal may be equalized to the phase of one input clock signal, and when the weight is 1, the phase of the output clock signal may be equalized to the phase of the other input clock signal.

Figure 1:
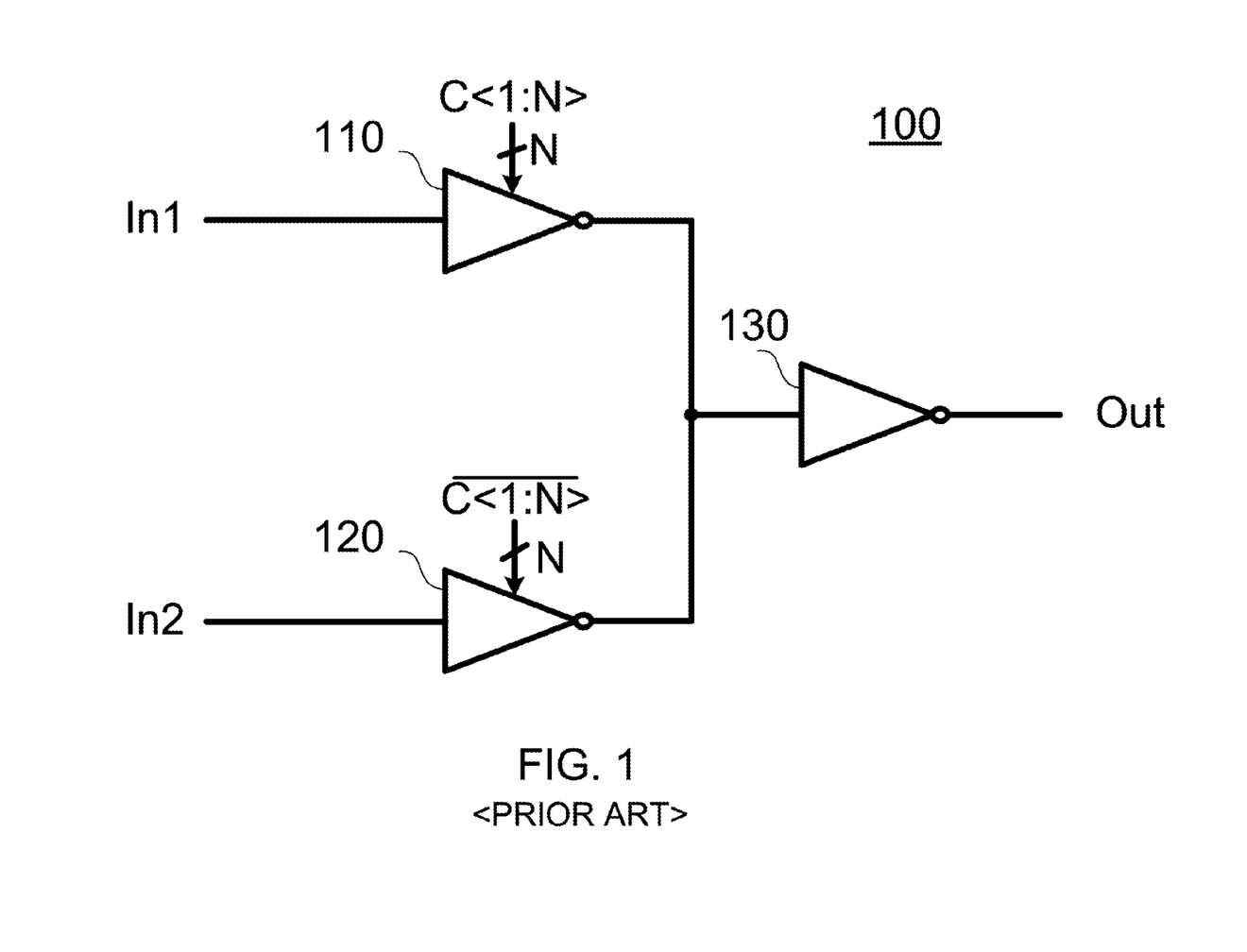
FIG. 1 is a circuit diagram of a conventional phase mixer circuit.

FIG. 1 is a circuit diagram of a conventional phase mixer circuit 100. The phase mixer circuit of FIG. 1 includes three inverters 110, 120, and 130, and is configured to receive first and second input clock signals In1 and In2, respectively, and generate an output clock signal Out. The first and second inverters 110 and 120 have input terminals to receive the first and second input clock signals In1 and In2, respectively, and output terminals shorted to each other to perform a mixing operation. The first and second inverters 110 and 120 also respectively receive the weight control codes C<1:N> and $\overline{C<1:N>}$ having a complementary relationship with each other. Here, the weight control code C<1:N> indicates a binary code value composed of N-bit binary numbers, and the weight control code $\overline{C<1:N>}$ is composed of N-bit inverted binary numbers of the weight control code C<1:N>. For example, when N is 3 and C<1:N> is "0 0 0", $\overline{C<1:N>}$ becomes "1 1 1". An input terminal of the third inverter 130 is coupled to a common output terminal of the first and second inverters 110 and 120, and an output terminal of the third inverter 130 is used as an output terminal Out of the phase mixer.

Figure 2:
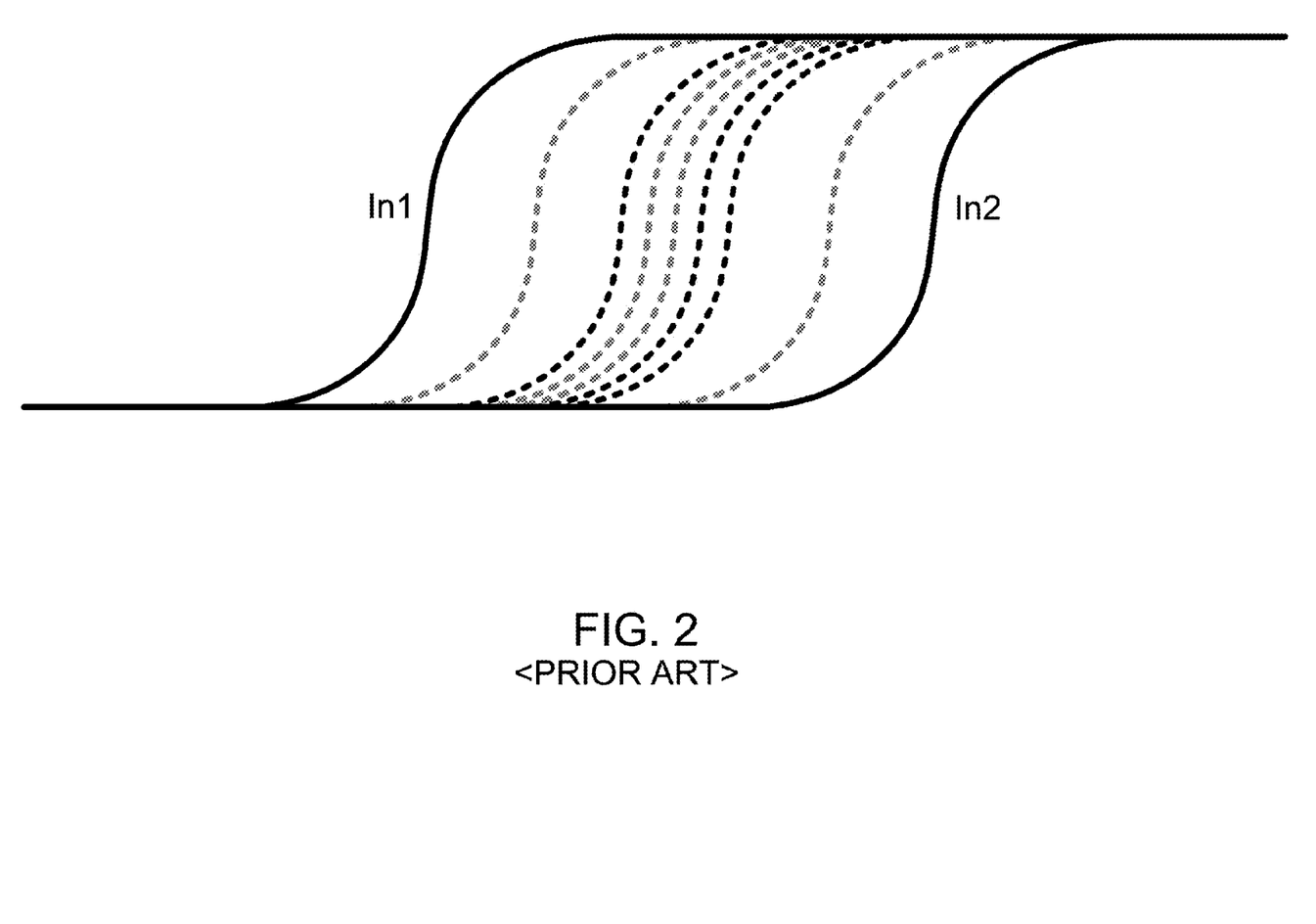
FIG. 2 is a waveform diagram for explaining a problem of the conventional phase mixer circuit.

FIG. 2 illustrates that, when N is 3, an output waveform Out of the phase mixer is changed depending on the weight control codes C<1:N> and $\overline{C<1:N>}$. For example, when the binary code values of the weight control codes C<1:3> and $\overline{C<1:3>}$ are ('0 0 0', '1 1 1'), the output waveform Out of the phase mixer is identical to that of the first input clock signal In1. Then, as the binary code values are increased one by one, the output waveform Out of the phase mixer continues moving toward the input waveform of the second input clock signal In2. When the binary code values of the weights C<1:3> and $\overline{C<1:3>}$ reach ('1 1 1', '0 0 0'), the output waveform Out of the phase mixer becomes identical to the waveform of the second input clock signal In2.

In general, it is desirable that a phase mixer has an equal delay difference between two adjacent output clock signals corresponding to two successive N-bit binary numbers of a weight control code, in order to increase a resolution of the output clock signal while reducing jitter. As illustrated in FIG. 2, however, it can be seen that delay differences between the two adjacent output clock signals are not equal to each other due to a drivability difference between pull-up and pull-down units of the first and second inverters 110 and 120, but the output waveforms converge toward an intermediate value of the weight control code. That is, the phase difference between the adjacent output clock signals around the intermediate value of the weight control code is smaller than that around the minimum or maximum value of the weight control code.

SUMMARY OF THE INVENTION

Accordingly, embodiments of the present invention have been made in an effort to solve the problems described above in the related art, and at least one advantage possible in the present invention is to provide a phase mixer circuit capable of equalizing phase differences of output clock signals due to a unit change of a weight control code in the entire range from the minimum value to the maximum value of the weight control code.

In order to achieve the above advantage, an embodiment of the present invention provides a multi-stage phase mixer circuit including: a first phase mixer configured to receive first and second input clock signals and output a first intermediate clock signal in response to a first coarse control signal; a second phase mixer configured to receive the first and second input clock signals and output a second intermediate clock signal in response to a second coarse control signal; and a third phase mixer configured to receive the first and second intermediate clock signals and output an output clock signal in response to a fine control signal.

BRIEF DESCRIPTION OF THE DRAWINGS

The details, and other features and advantages of the present invention will become more apparent after reading of the following detailed description taken in conjunction with the accompanying drawings, in which.

DETAILED DESCRIPTION OF PREFERRED EMBODIMENTS

Reference will now be made in greater detail to a preferred embodiment of the invention, an example of which is illustrated in the accompanying drawings. Wherever possible, the same reference numerals will be used throughout the drawings and the description to refer to the same or like parts.

Figure 3:
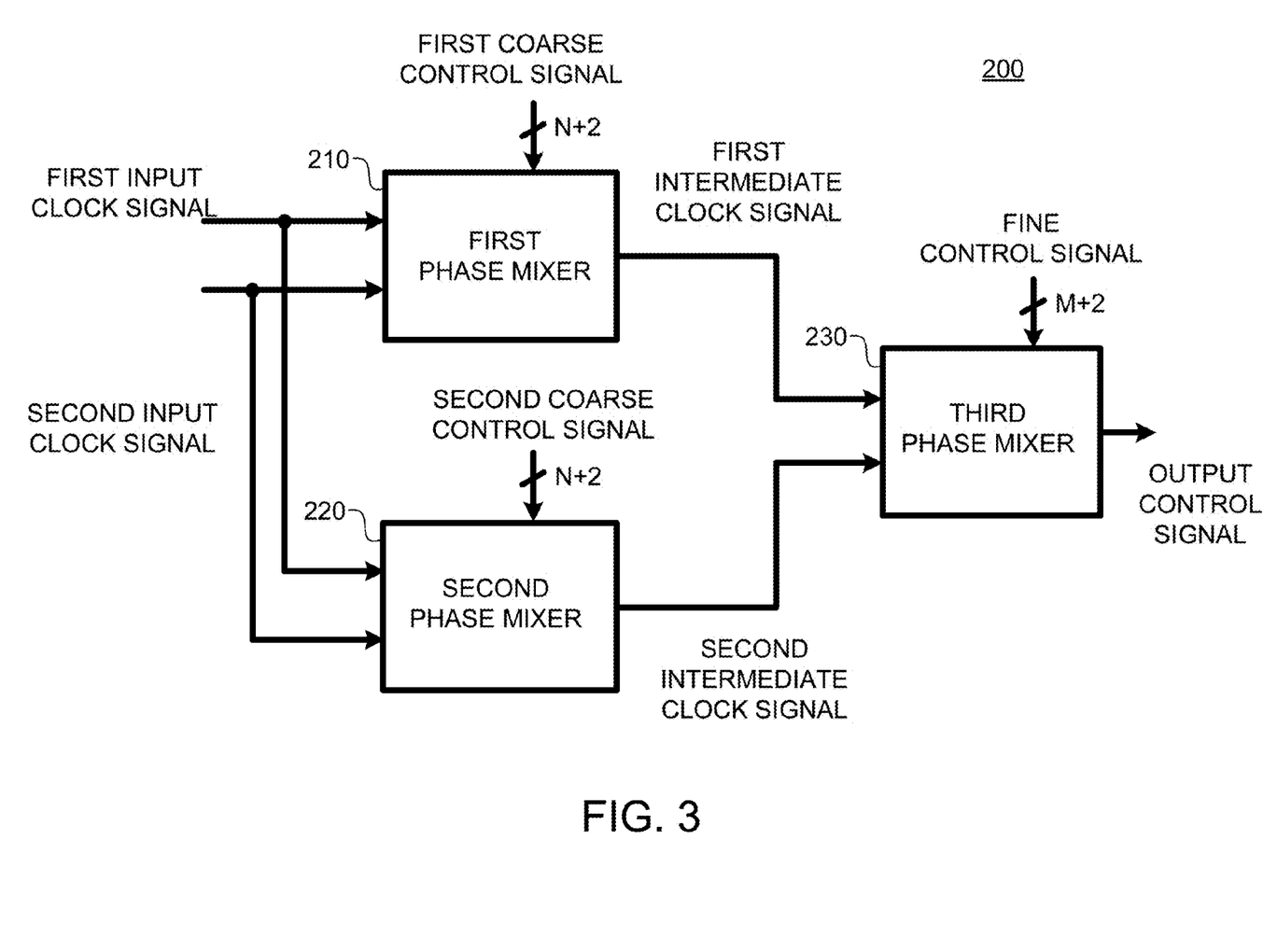
FIG. 3 is a schematic block diagram of a phase mixer circuit according to an embodiment of the present invention.

FIG. 3 is a schematic block diagram of a phase mixer circuit 200 according to an embodiment of the present invention. The phase mixer circuit according to the embodiment of the present invention receives two input clock signals, performs a phase mixing and phase control operation through two stages, and transmits an output clock signal. For this operation, the phase mixer according to this embodiment of the present invention as shown in FIG. 3 includes at least three mixers, that is, first mixer 210, second mixer 220, and third mixer 230. The first mixer 210 and second mixer 220 form a first-stage mixer, and the third mixer 230 forms a second-stage mixer. The first mixer 210 and second mixer 220 receive first and second input clock signals, and output first intermediate clock signal and second intermediate clock signal, respectively. The first and second intermediate clock signals are inputted to the second-stage mixer to generate an output clock signal. First and second coarse control signals are used to control phases of the first and second intermediate clock signals outputted from the first and second mixers 210 and 220, respectively, included in the first stage. A fine control signal is used to control a phase of the output clock signal outputted from the third mixer 230 included in the second stage.

Figure 4:
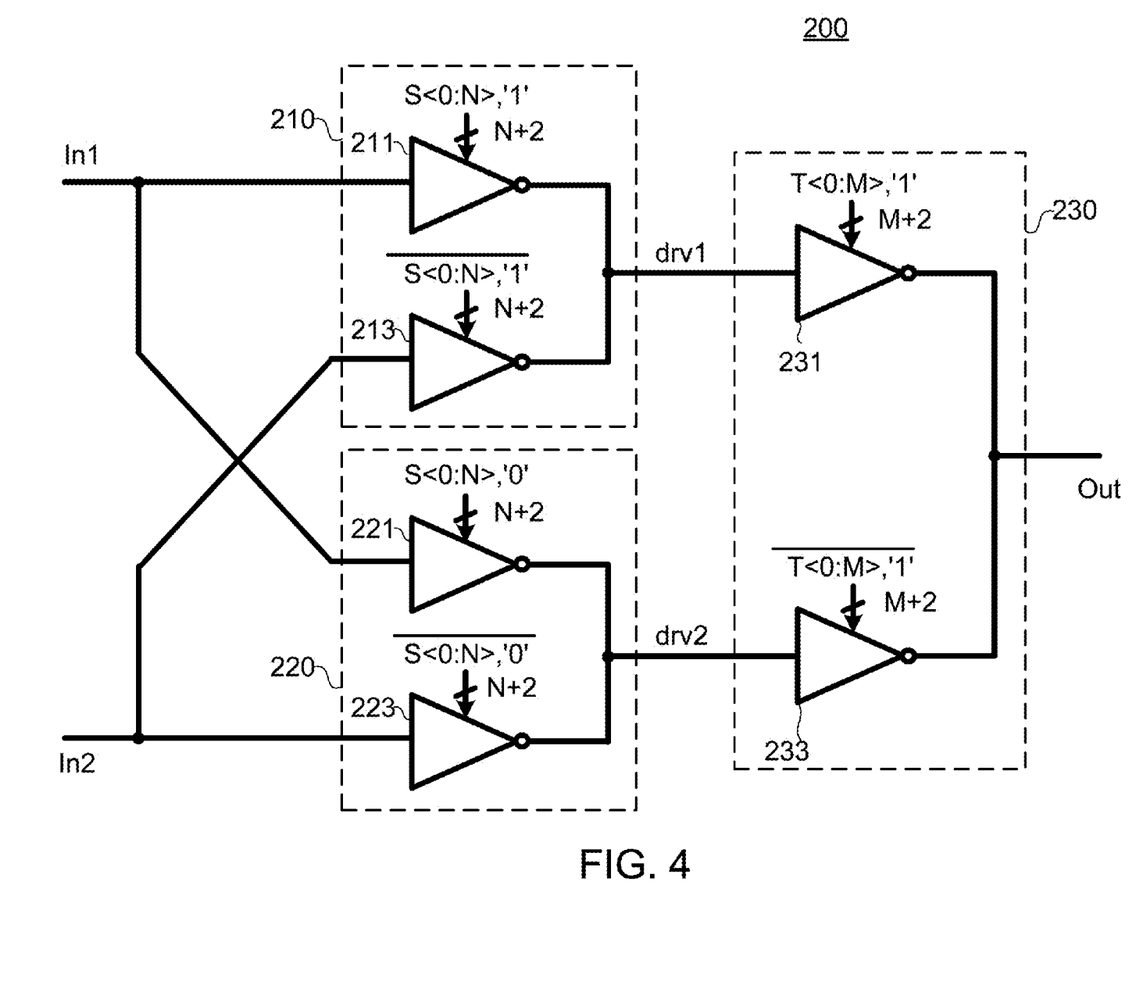
FIG. 4 is a detailed circuit diagram of the phase mixer circuit according to an embodiment of the present invention.

FIG. 4 is a detailed circuit diagram of the phase mixer circuit illustrated in FIG. 3, in accordance with an embodiment of the present invention. Hereinafter, the circuit of FIG. 4 will be described in more detail. For convenience of description, the first input clock signal In1 and second input clock signal In2 and the output clock signal Out have the same names as those of the conventional phase mixer circuit. In FIGS. 3 and 4, like reference numerals are commonly used. When the first and second input clock signals In1 and In2 are inputted to the first mixer 210, the first mixer 210 mixes the two received input clock signals In1 and In2 to generate a first intermediate clock signal drv1. Two inverters 211 and 213 forming the first mixer 210 have driving strengths decided by weight control codes (S<0:N>, '1') and ($\overline{S<0:N>}$,'1'), respectively. Like the first mixer 210, the second mixer 220 receives two input clock signals In1 and In2 and then mixes the received input clock signals In1 and In2 to generate a second intermediate clock signal drv2. Two inverters 221 and 223 forming the second mixer 220 have driving strengths decided by weight control codes (S<0:N>, '0') and ($\overline{S<0:N>}$,'0'), respectively. Each of the weight control codes (S<0:N>, '1') and (S<0:N>, '0') is a (n+2) bit thermometer code. Accordingly, a difference between the two codes corresponds to 1 LSB (least significant bit).

The third mixer 230 included in the second-stage mixer receives the two intermediate clock signals drv1 and drv2, mixes the two signals drv1 and drv2, and outputs the mixed signal to an output terminal (as an output clock signal Out) of the entire phase mixer. The two inverters 231 and 233 forming the third mixer 230 have driving strengths decided by weight control codes (T<0:M>, '1') and ($\overline{T<0:M>}$,'1'), respectively. The weight control code (T<0:M>, '1') is also a thermometer code.

Figure 5:
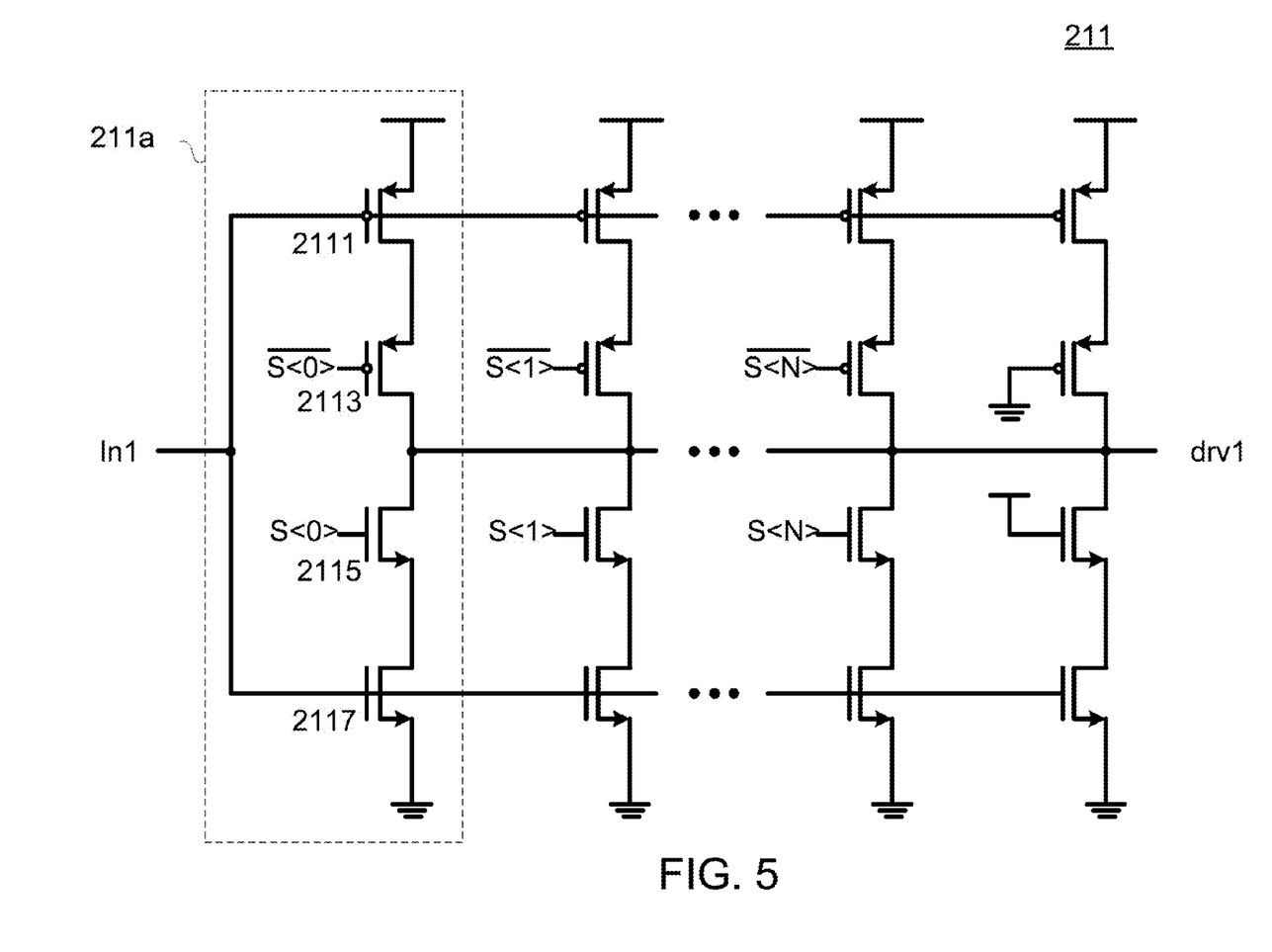
FIG. 5 is a detailed circuit diagram of a first inverter, in accordance with an embodiment of the invention.

FIG. 5 is a detailed circuit diagram of the first inverter 211 in accordance with an embodiment of the present invention. The first inverter 211 includes (N+2) unit tri-state inverters 211a which are coupled in parallel to operate as one inverting logic circuit. The first inverter 211 receives the first input clock signal In1 and outputs the first intermediate clock signal drv1. The driving strength of the first inverter 211 is decided by the (N+2)-bit thermometer code (S<0:N>, '1'). Each of (N+2) bit numbers and inverted (N+2) bit numbers of the thermometer code (S<0:N>, '1') is inputted to a gate of a first NMOS transistor 2115 and that of a first PMOS transistor 2113 included in the unit tri-state inverter 211a, respectively. Drains of the first NMOS 2115 and PMOS 2113 are tied to output the first intermediate clock signal drv1. Further, in the unit tri-state inverter 211a, each of the first NMOS transistor 2115 and PMOS 2113 transistor is coupled in series to a second NMOS transistor 2117 and a second PMOS transistor 2111, respectively. The gates of the transistors 2117 and 2111 are coupled to receive the first input clock single In1. When each of the unit tri-state inverters 211a has the same driving strength, the driving strength of the first inverter 211 is accurately proportional to the number of '1's in the thermometer code. For example, when the number of '1's in the thermometer code (S<0:N>, '1') is k, the phase ph{drv1} of the first intermediate clock signal drv1 outputted from the first phase mixer 210 having the thermometer codes (S<0:N>, '1') and ($\overline{S<0:N>}$,'1') as inputs in FIG. 4 is expressed as the following equation:

$$\text{ph}\{drv1\} = \frac{\text{ph}\{In1\} \times k + \text{ph}\{In2\} \times (N+2-k)}{N+2}.$$

The phase ph{drv2} of the second intermediate clock signal drv2 outputted from the second mixer 220 having the thermometer codes (S<0:N>, '0') and ($\overline{S<0:N>}$,'0') as inputs in FIG. 4 is expressed as the following equation:

$$\text{ph}\{drv2\} = \frac{\text{ph}\{In1\} \times (k-1) + \text{ph}\{In2\} \times (N+3-k)}{N+2}.$$

Therefore, the phase ph{drv1} of the first intermediate clock signal drv1 and the phase ph{drv2} of the second intermediate clock signal drv2 have a difference corresponding to 1 LSB of the weight control codes.

In FIG. 4, when the number of '1's in the weight control code (T<0:M>, '1') to the third mixer 230 is j, the phase ph{Out} of the output clock signal Out of the third mixer 230 is expressed as the following equation:

$$\text{ph}\{Out\} = \frac{\text{ph}\{drv1\} \times j + \text{ph}\{drv2\} \times (M+2-j)}{M+2}.$$

The other inverters 213, 221, 223, 231, and 233 of FIG. 4 have the same circuit configuration as that of the first inverter 211 of FIG. 5, but have different weight control codes from each other as, for example, shown in FIG. 4. However, the specific circuit configurations of the inverters 211, 213, 221, 223, 231, and 233 according to the embodiment of the present invention do not need to be limited to the specific circuit configuration illustrated in FIG. 5. Various circuit configurations using inverting logic circuits whose driving strengths are controllable may be implemented according to the technical idea of the present invention. Furthermore, because the inverting logic circuits such as inverters were taken as an example for convenience of description, non-inverting logic circuits may be used to implement the first to third mixers of the specific circuit configuration in accordance with the embodiment of the present invention.

Figure 6:
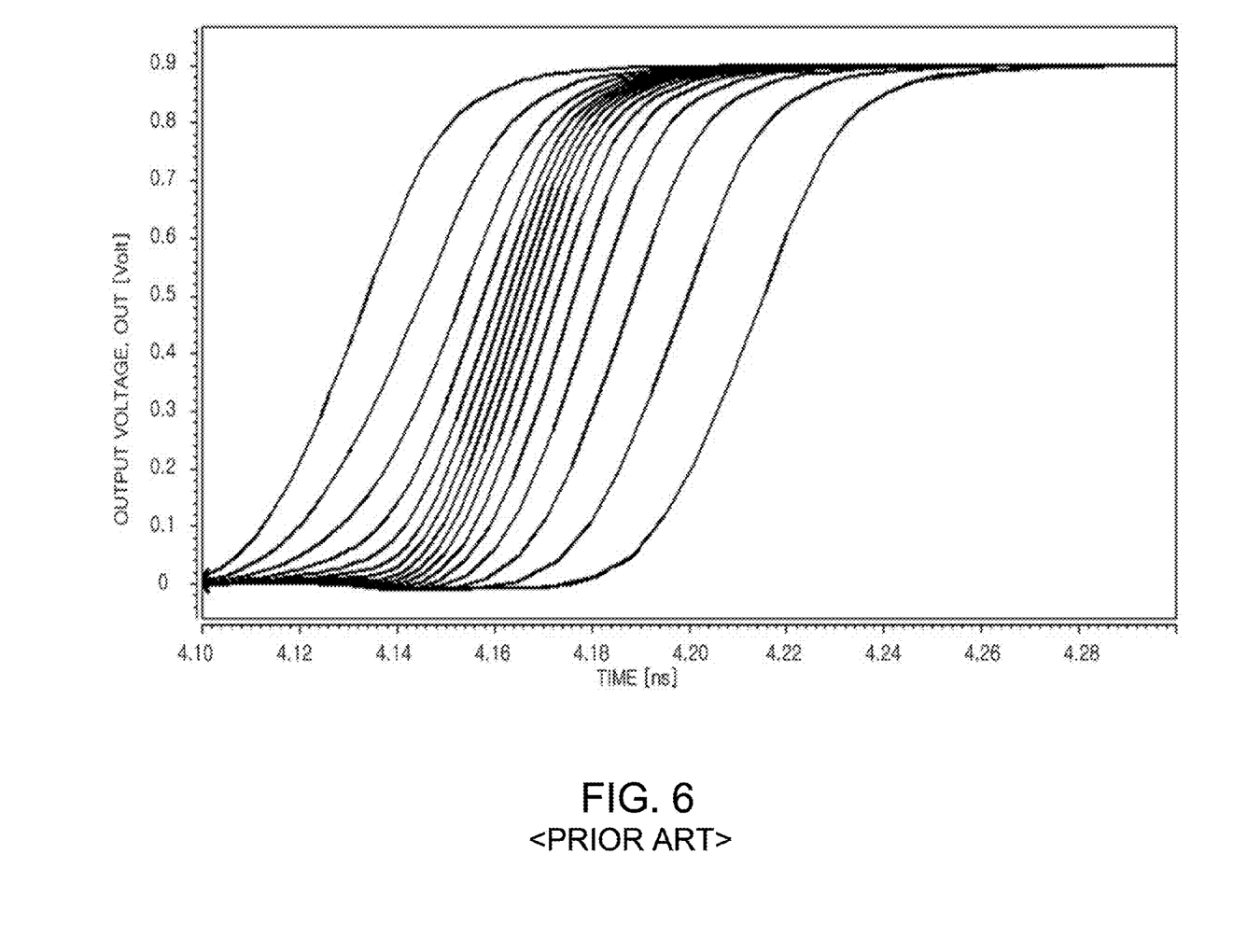
FIG. 6 is a waveform diagram of the conventional phase mixer circuit when a weight control code has four-bit binary numbers.

FIG. 6 illustrates 16 different output clock signals when the weight control codes of the conventional phase mixer circuit of FIG. 1 corresponds to four bits, in order to compare the conventional phase mixer circuit to the phase mixer circuit according to the embodiment of the present invention. Referring to FIG. 6, it can be seen that an interval between phase differences corresponding to a unit change of the weight control code decreases around a median value of the weight control code and increases around a minimum or a maximum value of the weight control code.

Figure 7:
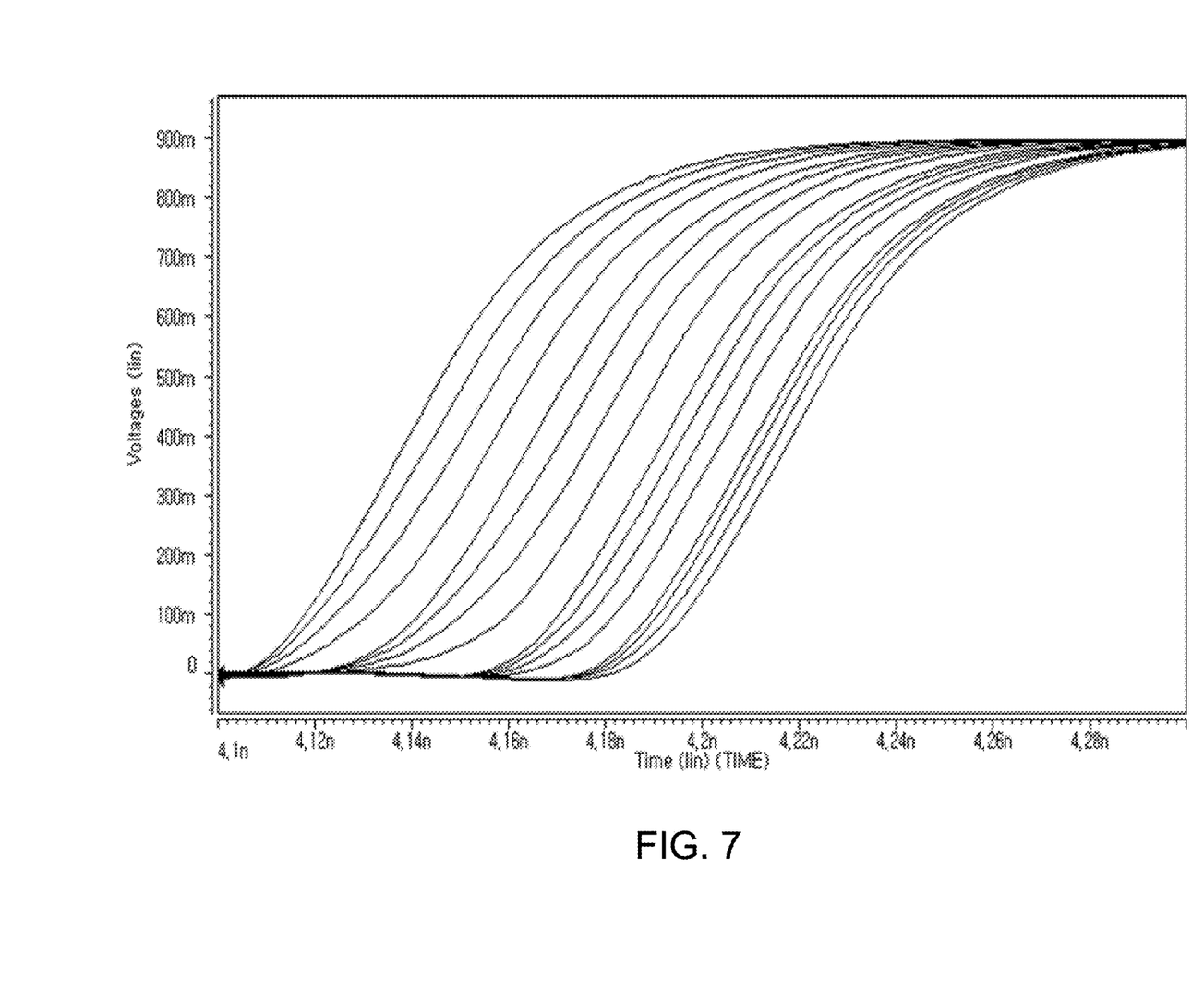
FIG. 7 is a waveform diagram of the phase mixer circuit according to an embodiment of the present invention when a weight control code has four-bit binary numbers.

On the other hand, when the same weight control code is applied to the phase mixer circuit according to an embodiment of the present invention, the above-described problems are significantly reduced as illustrated in FIG. 7. This is because the phase mixing operation is precisely performed through two stages. In the conventional phase mixer circuit of FIG. 1, a phase mixing operation is performed by in one-stage mixer including the first and second inverters 110 and 120. In the phase mixer circuit of FIG. 3 according to an embodiment of the present invention, the first mixing operation is performed in the first-stage phase mixer including the first and second phase mixers 210 and 220, and then the second mixing operation is performed in the second-stage phase mixer including the third phase mixer 230. During the phase mixing operation of the first-stage mixer, coarse control is performed by the weight control code, and during the phase mixing operation of the second-stage mixer, fine control is performed. During the phase mixing operation, coarse control is performed by the N+2 bit weight control code in the first-stage mixer, and fine control is performed by the M+2 bit fine control code in the second-stage mixer.

Figure 8:
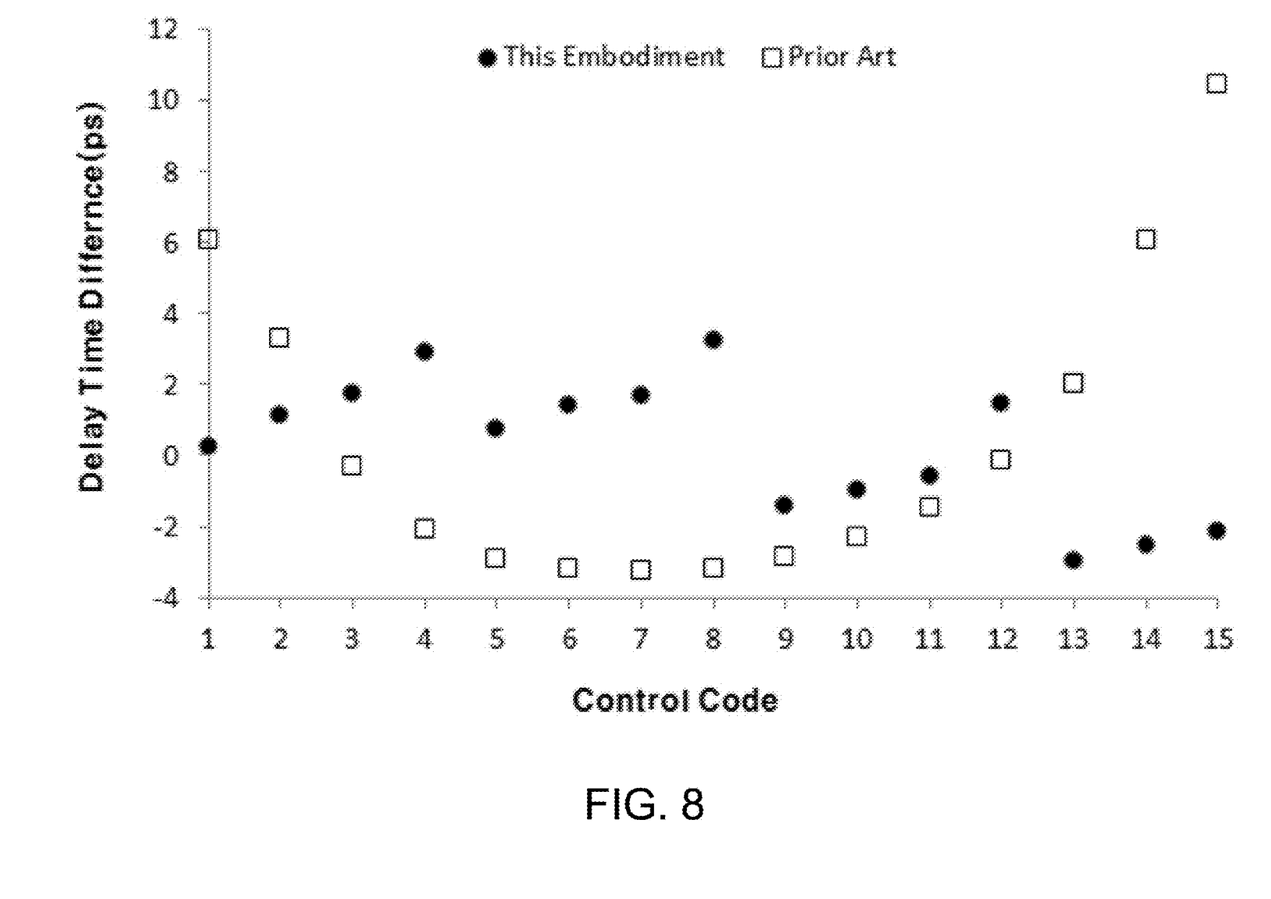
FIG. 8 illustrates a graph showing a comparison of delay time differences in the conventional phase mixer circuit to those in the phase mixer circuit according to an embodiment of the present invention.

FIG. 8 illustrates a graph showing a comparison of delay time differences corresponding to a unit change of control codes, based on ideal delay differences. More specifically, each of the delay time differences of the conventional phase mixer (labeled as "PRIOR ART") corresponding to a unit change of the weight control code represents a difference between a delay time interval of two adjacent output signals outputted from the conventional phase mixer and that from an ideal phase mixer. The delay time differences of an embodiment of the present invention (labeled as "THIS EMBODIMENT") are defined similarly. In the case of the conventional phase mixer, the maximum delay time difference deviating from the ideal delay interval corresponds to approximately 10 ps corresponding to the last unit change of the weight control code. However, in the case of the two-stage phase circuit according to an embodiment of the present invention, all of the waveforms are formed within a delay time difference of approximately 4 ps.

Figure 9:
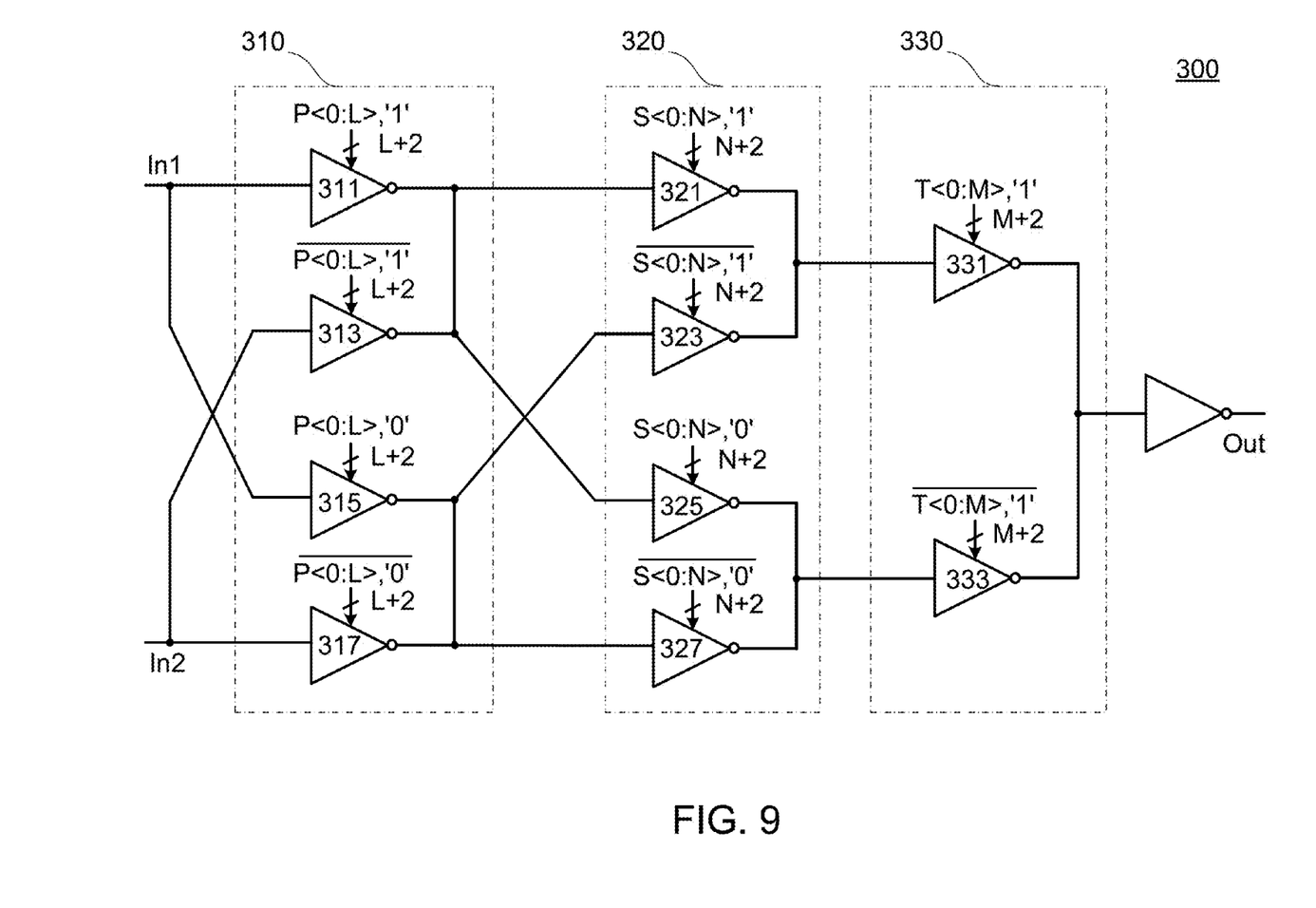
FIG. 9 illustrates a phase mixer circuit according to another embodiment of the present invention.

FIG. 9 illustrates a phase mixer circuit according to another embodiment of the present invention. Hereinafter, as the phase mixer circuit according to this embodiment of the present invention is described in more detail, the technical idea of the present invention will be further expanded and clarified. FIG. 9 is a circuit diagram of a three-stage phase mixer circuit 300. First-stage phase mixer 310 and second-stage phase mixer 320 generate clock signals whose internals may be properly controlled between the minimum and maximum values of phase delay by first-stage weight control codes (P<0:L>, '1') and (P<0:L>, '0'), first-stage complementary signals ($\overline{P<0:L>}$,'1') and ($\overline{P<0:L>}$,'0'), second-stage weight control codes (S<0:N>, '1') and (S<0:N>, '0'), and second-stage complementary signals ($\overline{S<0:N>}$,'1') and ($\overline{S<1:N>}$,'0'). The three-stage phase mixer 330 mixes and controls outputs of the second-stage phase mixer 320 according to a third-stage weight control code (T<0:M>, '1') and a third-stage complementary signal ($\overline{T<0:M>}$,'1'), and outputs a final clock signal Out. In the weight control codes inputted to the respective stages, L, N, and M are integers representing bit numbers of the respective weight control codes.

Figure 10:
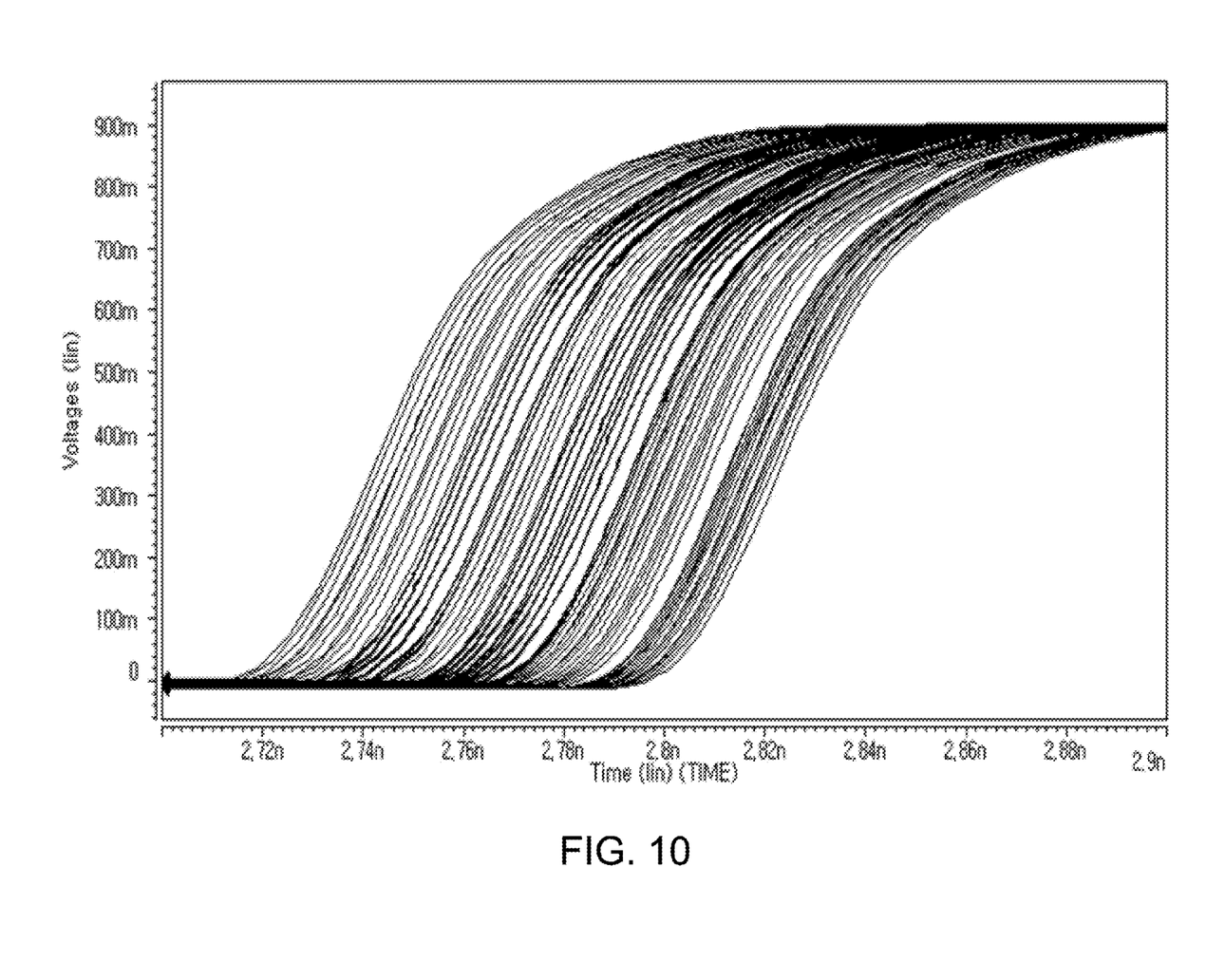
FIG. 10 is a waveform diagram of the phase mixer circuit according to another embodiment of the present invention illustrated in FIG. 9.

FIG. 10 illustrates a result obtained by simulating the three-stage phase mixer 300 of FIG. 9 according to an embodiment of the present invention. FIG. 10 illustrates 64 different phase outputs when the weight control code has six-bit binary numbers. Referring to FIG. 10, it can be seen that delay time differences between two adjacent final output signals corresponding to a unit change of the weight control code are substantially equal to each other.

The multi-stage phase mixer circuit according to an embodiment of the present invention may reduce a phase error and jitter by improving the phase resolution characteristic of the output clock signal, thereby supplying a signal with a more precise phase.

According to an embodiment of the present invention, it is possible to equalize the phase differences between two output clock signals corresponding to a unit change of the weight control code in the entire range from the minimum value to the maximum value of the weight control code.

Although a preferred embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A multi-stage phase mixer circuit comprising:
  a first phase mixer configured to receive first and second input clock signals and output a first intermediate clock signal according to first coarse control of a first coarse control signal;
  a second phase mixer configured to receive the first and second input clock signals and output a second intermediate clock signal according to second coarse control of a second coarse control signal; and
  a third phase mixer configured to receive the first and second intermediate clock signals and output an output clock signal according to fine control of a fine control signal, the fine control adjusting a phase of the output clock signal more finely than the first and second coarse controls adjust phases of the first and second intermediate clock signals, respectively,
  wherein each of the first, second, and third phase mixers comprises two or more inverting logic circuits, and
  wherein an inverting logic circuit among the two or more inverting logic circuits of the first phase mixer includes a string that has two PMOS transistors and two NMOS transistors coupled in series, a gate of one of the PMOS transistors coupled to ground, and a gate of one of the NMOS transistors coupled to a power source that provides a voltage level corresponding to a logical high value.

2. The multi-stage phase mixer circuit of claim 1, wherein the multi-stage phase mixer circuit performs a phase mixing operation through two stages by performing a first phase mixing operation using the first and second phase mixers and performing a second phase mixing operation using the third phase mixer.

3. The multi-stage phase mixer circuit of claim 1, wherein the first and second coarse control signals have a difference of 1 least significant bit (LSB).

4. The multi-stage phase mixer circuit of claim 1, wherein the first and second intermediate clock signals have a delay time difference corresponding to 1 LSB of the first and second coarse control signals.

5. The multi-stage phase mixer circuit of claim 1, wherein the first and second input clock signals are inputted to the two or more inverting logic circuits of the first and second phase mixers, respectively.

6. The multi-stage phase mixer circuit of claim 1, wherein outputs of the two or more inverting logic circuits of the first phase mixer are shorted to each other, and outputs of the two or more inverting logic circuits of the second phase mixer are shorted to each other.

7. The multi-stage phase mixer circuit of claim 1, wherein the two or more inverting logic circuits are controlled by one of the first and second coarse control signals including weight control codes having a complementary relationship with respect to each other.

8. A method for performing a phase mixing operation, comprising:
   receiving first and second input clock signals, and outputting a first intermediate clock signal according to first coarse control of a first coarse control signal;
   receiving the first and second input clock signals, and outputting a second intermediate clock signal according to second coarse control of a second coarse control signal; and
   receiving the first and second intermediate clock signals, and outputting an output clock signal according to fine control of a fine control signal, the fine control adjusting a phase of the output clock signal more finely than the first and second coarse controls adjust phases of the first and second intermediate clock signals, respectively,
   wherein a first phase mixer performs the first coarse control, a second phase mixer performs the second coarse control, and a third phase mixer performs the fine control,
   wherein each of the first, second, and third phase mixers comprises two or more inverting logic circuits, and
   wherein an inverting logic circuit among the two or more inverting logic circuits of the first phase mixer includes a string that has two PMOS transistors and two NMOS transistors coupled in series, a gate of one of the PMOS transistors coupled to ground, and a gate of one of the NMOS transistors coupled to a power source that provides a voltage level corresponding to a logical high value.

9. The method of claim 8, wherein the first and second coarse control signals have a difference of 1 least significant bit (LSB).

10. The method of claim 8, wherein the first and second intermediate clock signals have a delay time difference corresponding to 1 LSB of the first and second coarse control signals.

11. The method of claim 8, wherein each of the first and second coarse control signals includes respective weight control codes having a complementary relationship with respect to each other.

* * * * *